United States Patent [19]

Taniguchi

[11] Patent Number: 5,710,620
[45] Date of Patent: Jan. 20, 1998

[54] PROJECTION EXPOSURE METHOD AND APPARATUS

[75] Inventor: Tetsuo Taniguchi, Yokohama, Japan

[73] Assignee: Nikon Corporation, Tokyo, Japan

[21] Appl. No.: 505,996

[22] Filed: Jul. 24, 1995

Related U.S. Application Data

[63] Continuation of Ser. No. 212,825, Mar. 15, 1994, abandoned.

[30] Foreign Application Priority Data

Mar. 16, 1994 [JP] Japan ................... 5-055246

[51] Int. Cl.$^6$ ........................... G03B 27/42
[52] U.S. Cl. .................. 355/53; 355/62; 355/71; 430/5
[58] Field of Search ............... 355/53, 67, 71; 430/5

[56] References Cited

U.S. PATENT DOCUMENTS

| | | | |
|---|---|---|---|
| 4,558,949 | 12/1985 | Uehara et al. | 356/152 |
| 4,650,983 | 3/1987 | Suwa | 250/204 |
| 4,666,273 | 5/1987 | Shimizu et al. | 353/101 |
| 4,770,531 | 9/1988 | Tanaka et al. | 356/358 |
| 4,924,257 | 5/1990 | Jain | 355/53 |
| 4,931,830 | 6/1990 | Suwa et al. | 355/71 |
| 5,117,255 | 5/1992 | Shiraishi et al. | 355/53 |
| 5,184,176 | 2/1993 | Unno et al. | 355/53 X |
| 5,194,893 | 3/1993 | Nishi | 355/53 |
| 5,251,067 | 10/1993 | Kamon | 355/53 X |
| 5,256,881 | 10/1993 | Yamazaki et al. | 250/492.23 |
| 5,270,771 | 12/1993 | Sato | 355/53 |
| 5,291,239 | 3/1994 | Jackson | 355/53 |
| 5,337,097 | 8/1994 | Suzuki et al. | 353/101 |
| 5,363,172 | 11/1994 | Tokoda | 355/71 |
| 5,448,332 | 9/1995 | Sakakibara et al. | 355/53 |
| 5,461,237 | 10/1995 | Wakamoto et al. | 250/548 |
| 5,502,311 | 3/1996 | Imai et al. | 250/548 |

FOREIGN PATENT DOCUMENTS

| | | |
|---|---|---|
| 61-91662 | 5/1986 | Japan . |
| 62-229838 | 10/1987 | Japan . |
| 4-162039 | 6/1992 | Japan . |
| 4-165352 | 6/1992 | Japan . |

OTHER PUBLICATIONS

Naomasa Shiraishi et al., *SPIE/Optical/Laser Microlithography V*, "New Imaging Technique For 64M-DRAM" vol. 1674, Mar. 11–13, 1992, pp. 741–752.

*Primary Examiner*—Daniel P. Malley
*Attorney, Agent, or Firm*—Shapiro and Shapiro

[57] ABSTRACT

An exposure apparatus comprises an illumination optical system for irradiating an illuminating light onto a mask having a plurality of patterns for which pattern forming conditions differ from one another, and a projection optical system for projecting images of said plurality of patterns onto a photosensitive substrate, a device for compensating imaging errors of pattern images to be projected onto said substrate, and a control system for controlling the operation of said compensating device in accordance with imaging errors of said plurality of pattern images so that said plurality of pattern images may be projected in specified imaging characteristics.

18 Claims, 9 Drawing Sheets

PROJECTION EXPOSURE METHOD AND APPARATUS

This is a continuation of application Ser. No. 08/212,825 filed Mar. 15, 1994, now abandoned.

BACKGROUND OF THE INVENTION

1. Field of the Invention

The present invention relates to a projection exposure apparatus which is required to provide high precision imaging characteristics, for example, for manufacturing semiconductor integrated circuits and liquid crystal devices and, more particularly,is concerned with maintenance of the imaging performance of a projection optical system.

2. Related Background Art

A projection exposure apparatus (for example, a stepper) projects an image of a pattern formed on a mask or a reticle (hereinafter collectively referred to as the "reticle") onto a photo-sensitive substrate (a semiconductor wafer or a glass plate to which a photo resist is applied) for forming an image through a projection optical system. Usually, a circuit pattern comprising a transmitting part with a transmissivity of approximately 100% for an illumination light and a shielding part with a transmissivity of approximately 0% for same is formed a reticle (a glass substrate made of quartz or the like). In addition, it has been proposed to use a phase-shifted reticle which is provided with a phase shifter for deviating a phase of light from a specific portion of the transmitting part of the circuit pattern on the reticle as much as π (rad) relative to light from another portion the other transmitting part. The phase-shifted reticle allows transferring of a more precise pattern than in the use of the reticle (hereinafter referred to as the "ordinary reticle") which comprises only the above-described shielding part and transmitting part. In other words, the former reticle yields an effect for improving the resolution. Representative phase-shifted reticles are a space frequency modulated type disclosed in the Japanese Patent Publication No. 62-50811, a half tone type disclosed in Japanese Patent Application Laid-open No. 4-162039 (the assignee filed as U.S. Ser. No. 780,249 (Oct. 22, 1991)), a shifter-shielded type disclosed Japanese Patent Application Laid-open No. 4-165352, and an edge-emphasized type. In the case that the phase-shifted reticle is used, a coherence factor (ρ value) of the illumination optical system should be optimized.

There have been made various attempts which would enable the transfer of a high precision pattern by optimization of illuminating conditions or improving the exposing method. For example, the U.S. Pat. No. 4,931,830 has disclosed a method for improving the resolution and the depth of focus by selecting a combination of an optimum numerical aperture (ρ value) of the illumination optical system and an optimum numerical aperture (N. A.) of the projection optical system for each specific pattern line width. The Japanese Patent Application Laid-open No. 61-91662 has disclosed a ring zone illuminating method for limiting an illuminating light, which passes through a pattern formation plane of a reticle and a plane in the illumination optical system (hereinafter referred to as the "pupil plane" of the illumination optical system) in relation to the Fourier transformation, to a ring zone area. In addition, as the assignee has filed as the U.S. Ser. No. 791,138 (Nov. 13, 1991), there has been proposed a deformed light source method for limiting the illuminating light, which passes through the pupil plane of the illumination optical system, to a plurality of local areas which are eccentrically deviated from the optical axis. The deformed light source method is described in detail, for example, in SPIE Optical/Laser Microlithography V Vol. 1674–1992. In any of the above described methods, however, the method itself is not effective for all reticle patterns, that is, the line width and the shape, and it is necessary to select optimum method and conditions of illumination for each reticle or pattern. Therefore, the projection exposure apparatus requires a construction which allows variation of the illuminating conditions in the illumination optical system.

In the projection exposure apparatus, it has increasingly been demanded in recent years to maintain the imaging characteristics (magnification of projection, focusing position, etc.) of the projection optical system at fixed values in high accuracies. Therefore various methods for compensating the imaging characteristics have been proposed and actually applied. For example, a method for compensating variations of the imaging characteristics due to absorption the exposure light of the projection optical system has been disclosed, for example, in the U.S. Pat. No. 4,666,273. In this method, a quantity of energy (quantity of heat) which has been accumulated in the projection optical system along with incidence of the exposure light into the projection optical system is calculated in sequence, variations of the imaging characteristics in accordance with the quantity of accumulated energy are evaluated and the imaging characteristics are finely adjusted by the specified compensating mechanism. This compensating mechanism is such that a space between two of a plurality of lens elements is tightly sealed and the pressure in this tightly sealed space is adjusted.

Such high resolution technology as described above is intended to maximally utilize the effective diameter of the projection optical system. However on the pupil plane of the projection optical system, there is a large difference of light intensity distribution between the ordinary reticle and the phase-shifted reticle. In addition, the light intensity distribution on the pupil plane of the projection optical system largely differs with the illuminating method for the reticle, that is, ordinary illumination, ring zone illumination or deformed light source illumination. Though the projection optical system is highly compensated for aberration, it can be concluded that such compensation is incomplete for the reasons of restrictions in design and manufacture. Consequently, if the light intensity distribution differs on the pupil plane of the projection optical system, that is, if the light path for the illuminating light which passes through inside the projection optical system differs, the illuminating light is affected by a different aberration. An amount of this effect cannot be negligible for those patterns which have lately tended to be increasingly finer. For example, the focusing position differs with the light intensity distribution on the pupil plane due to a spherical aberration of the projection optical system. It is known that the magnification of projection and the distortion of image are similarly affected by coma aberration. Particularly, if a change of temperature distribution occurs in the projection optical system upon a temperature rise due to absorption of the exposure light by the projection optical system itself, the above described aberration becomes larger to result in a serious problem.

For solving the above problem, it is considered to adapt the projection optical system having compensating means for the imaging characteristics so that the amount of compensation by the compensating means is varied in accordance with the type of reticle and the illuminating conditions of the illumination optical system and the imaging characteristics are compensated to an optimum state in accordance with the light intensity distribution on the pupil plane of the projection optical system. For example, Japanese Patent Application Laid-open No. 62-229838 (filed as U.S. Ser. No. 945,648 (Dec. 23, 1986) by the assignee) has disclosed a method for compensating the imaging characteristics in accordance with the light intensity distribution on the pupil plane of the projection optical system when the numerical aperture, that is, the ρ value of the illumination optical system, is changed. In this case, the illuminating conditions of the illumination optical system are primarily determined for one exposure. In other words, the illuminating conditions are not changed for the same reticle and the reticle is illuminated under the same illuminating conditions.

However, various types of patterns having different forming conditions may be formed on the reticle. For example, the normal pattern comprising the transmitting part and the shielding part and the phase-shifted pattern which is partly covered with a phase shifter may be provided together on the same reticle. In exposure of a reticle on which a plurality of patterns are inclusively provided (hereinafter referred to as the "mixed reticle"), the light intensity distribution on the pupil plane of the projection optical system can be varied for each pattern. Therefore there has been a problem that, the imaging characteristics of the projection optical system are compensated with an emphasis of view only on one type of pattern on the reticle, whereby the imaging characteristics of the remaining pattern cannot be compensated and a satisfactory pattern image cannot be obtained on the overall reticle.

The mixed reticle is not limited to a combination of the normal pattern and the phase-shifted pattern. For example, in the case of a reticle composed of only the normal type pattern, the preciseness (line width and pitch) may differ from one pattern another. A problem as described above may occur with such a mixed reticle. This is because an angle of a diffracted light from the pattern differs depending upon the preciseness of the pattern, that is, the light intensity distribution on the pupil plane of the projection optical system differs with each pattern.

SUMMARY OF THE INVENTION

An object of the present invention is to provide a projection exposure apparatus capable of projecting all patterns under satisfactory imaging characteristics even though there are a plurality of different patterns for which forming conditions are different on the reticle.

Therefore, for a projection exposure apparatus which has an illumination optical system for irradiating an illuminating light onto a mask in an approximately uniform intensity distribution, a projection optical system for projecting a mask pattern image onto a photosensitive substrate, and an imaging characteristics compensating means for compensating the imaging characteristics of the projection optical system, the present invention provides input means for entering information regarding respective pattern forming conditions (for example, a type of reticle pattern, preciseness, illuminating conditions, process factors of the photosensitive substrate, etc.) of a plurality of pattern areas on the mask and calculating means for calculating an amount of compensation, by the imaging characteristics compensating means, common to each of a plurality of pattern areas in accordance with the information entered. Exposure control means for interrupting an exposing operation when an amount of compensation common to each of a plurality of pattern areas is not determined may also be provided.

In the present invention, when there are a plurality of patterns (areas) in the specified area on the mask which should be transferred onto a photosensitive substrate only by one exposure, the imaging characteristics for each pattern are to be obtained according to the forming conditions for each of a plurality of patterns and a satisfactory amount of compensation common to each of a plurality of patterns is calculated (determined) from the imaging characteristics. Therefore, the imaging characteristics of the projection optical system can be appropriately compensated for all of a plurality of patterns on the mask and all patterns can be projected under satisfactory imaging characteristics. If a difference in the imaging characteristics with respect to all of a plurality of patterns becomes larger along with an environmental change, absorption of exposure light, etc., and there is no compensation amount common to all patterns, the exposure operation is stopped. Therefore manufacturing of defective products is prevented and the yield rate is improved.

DESCRIPTION OF THE PREFERRED EMBODIMENTS

Figure 1:
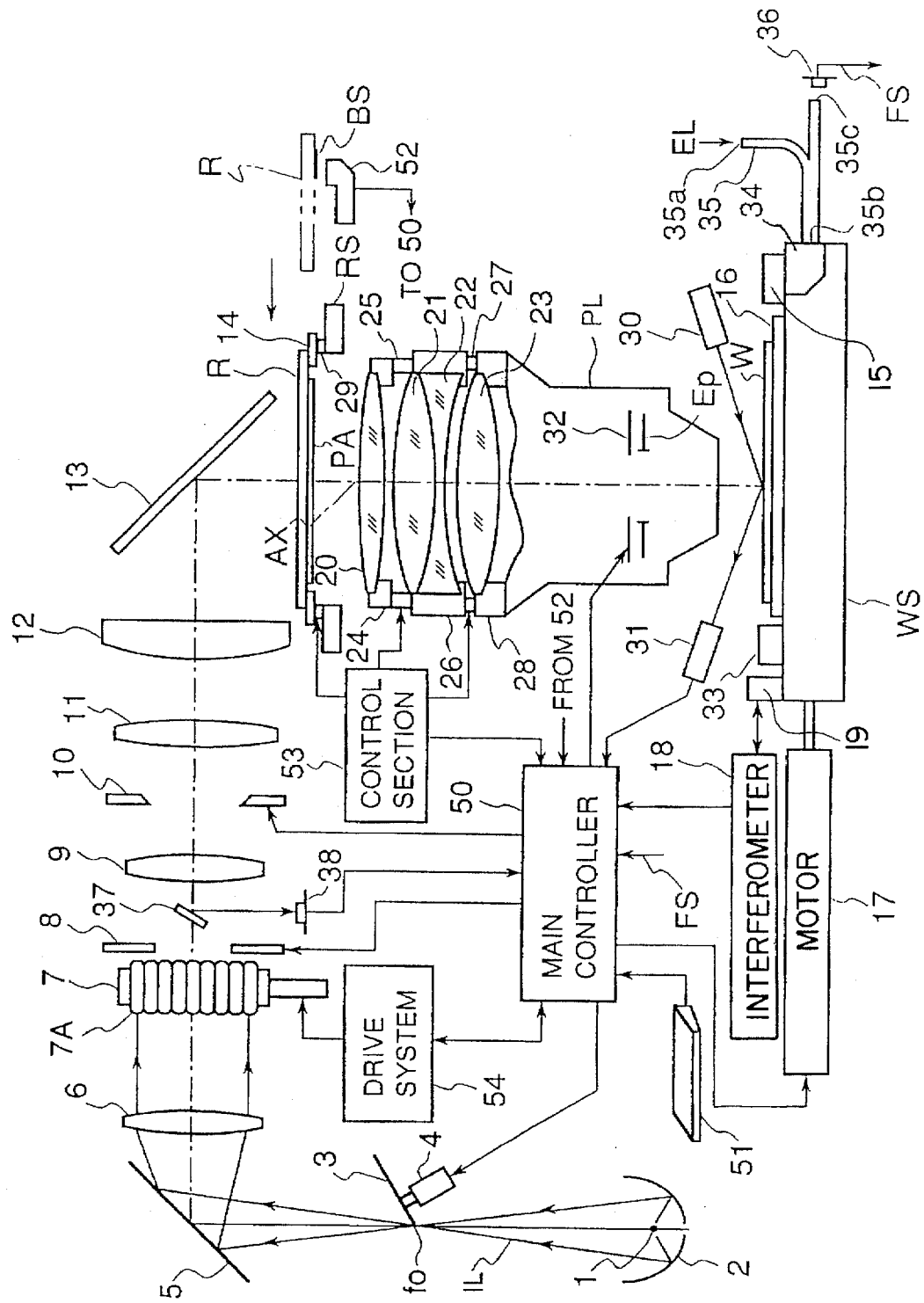
FIG. 1 is a schematic diagram showing a configuration of a projection exposure apparatus in accordance with an embodiment of the present invention.

Referring to FIG. 1, a projection exposure apparatus in accordance with an embodiment of the present invention is shown. In FIG. 1, a super high pressure mercury lamp 1 generates an illumination light IL with a wavelength suitable for exposing a photosensitive resist layer. As the illuminating light IL, a laser beam of KrF or ArF excimer laser or a higher harmonic of a metal vapor laser or YAG laser can be used in addition to the bright line (i line) of a super high pressure voltage mercury lamp 1. After the illuminating light IL is reflected by an oval mirror 2 and condensed to a the second focusing point $f_o$, the illuminating light IL is introduced into an optical integrator (a fly pupil lens group or fly eye lens) through a condensing optical system 6 including a cold mirror 5 and a collimator lens. A variable aperture diaphragm ($\rho$ diaphragm) 8 for varying the numerical aperture $NA_{IL}$ (i.e. a coherence factor $\rho$) of the illumination optical system is arranged near the emission plane (reticle side focal plane) of the fly pupil lens group.

The fly pupil lens group 7A is arranged so that its reticle side focal plane is approximately aligned with the Fourier transformation plane for the pattern plane of the reticle R in the illumination optical system. A plane light source image (an assemblage of a plurality of spot light sources corresponding to respective elements of the fly pupil lens group 7A) is formed on the reticle side focal plane. Accordingly, the variable aperture diaphragm 8 specifies the shape and dimensions of the plane light source image. The fly pupil lens group 7A is used in normal illumination for the reticle and a number of lens elements are arranged around the light axis AX in a plane normal to the light axis AX. A shutter 3 (for example, a 4-blade rotary shutter) for closing and opening the light path of the illuminating light IL by means of a motor 4 is arranged nearby the second focus $f_o$ In this embodiment, a plurality of fly pupil lens groups including the fly pupil lens group 7A, though not shown, are provided on a holding member 7 (for example, a rotary turret plate) and adapted so that optional fly pupil lens groups are arranged to be replaceable in the illumination light path by a drive system 54. Thus the illuminating conditions ($\rho$ value, normal illumination, ring zone illumination and grading illumination) can be changed in accordance with the type of reticle, preciseness of the pattern and cyclicity by arranging the variable aperture diaphragm 8 and each of a plurality of fly pupil lens groups to be replaceable. Particularly in this embodiment, a set of fly pupil lens group includes a plurality of fly pupil lenses (two or four lenses) whose centers are respectively located at a plurality of positions eccentrically deviated from the light axis AX of the illumination optical system for grading illumination. If the fly pupil lenses groups are replaced, the shape and the size of the plane light source image, and thus the intensity distribution of the illumination light, at the Fourier transformation plane (pupil plane) in the illumination optical system also vary accordingly. Thus, the fly pupil lenses together with the holding member constitute a device for changing a distribution of intensity of the illumination light. For example, a ring zone type plane light source image is formed in the ring zone illumination method and a plurality of plane light source images which are eccentrically deviated from the light axis of the illumination optical system are formed in the deformed light source method (the inclining illumination method). Particularly in the deformed light source method, the positions of a plurality of plane light source images (the position of the center of gravity of the light quantity distribution).

The illuminating light IL emitted from the fly pupil lens group 7A passes through a semi-transmitting mirror 37, relay lenses 9 and 11, a variable blind 10 and a main condenser lens 12 to reach a mirror 13 and is vertically reflected down, then irradiates the pattern area PA of the reticle R with almost uniform brightness. Since the surface of the variable blind 10 is conjugate with the reticle R, the illumination field of the reticle R can be set as required by changing the size and the shape of the aperture by driving a plurality of movable blades which form the variable blind 10 with a motor (not shown).

The reticle R is held by a reticle holder 14, which mounted on a reticle stage RS which can be 2-dimensionally moved in a horizontal plane through a plurality of expandable driving elements 29 (only two driving elements shown in FIG. 1). A driving element control section 53 allows the reticle R to be moved in parallel in the light axis direction of the projection optical system PL and to be slanted in any direction in the plane normal to the light axis AX, by controlling an amount of expansion of each driving element 29. The above arrangement enables compensation of the imaging characteristics of the projection optical system, particularly a bobbin type or a barrel type distortion. The reticle R is positioned so that the center of the pattern area PA is aligned with the light axis AX. The light flux from the projection optical system separated from the semi-transmitting mirror 37 is detected by a photoelectric transducer element 38.

The illuminating light IL which has passed through the pattern area PA of the reticle R enters into a telecentric projection optical system PL, which is telecentric at both sides. The projection optical system PL forms an image on a wafer W on which a resist layer is formed and the surface of the resist layer is approximately aligned with the best imaging plane. In this embodiment, as disclosed, for example, in U.S. Pat. No. 5,117,255, some lens elements 20 (21, 22) which form the projection optical system PL can be independently driven by the driving element control section 53 to permit compensation of the imaging characteristics, for example, the magnification of projection, distortion, etc. Also, as disclosed to U.S. Pat. No. 4,931,830, a variable aperture diaphragm 32 is provided in the pupil plane (that is, an optical Fourier transformation plane for the pattern plane of the reticle R) Ep of the projection optical system PL or in a nearby plane. Therefore the numerical aperture NA of the projection optical system can be changed as required. In the system shown in FIG. 1, the Keller's illumination method which is conjugated with the position of the plane optical source image where the pupil plane Ep of the projection optical system PL is optogeometrically specified by the aperture diaphragm 8 is applied but the method to be employed need not always be the Keller's illumination method.

A wafer W is pulled by vacuum suction against the wafer holder ($\theta$ table) 16 and held on the wafer stage WS with the wafer holder. The wafer stage WS can be tilted in any direction in the best imaging plane of the projection optical system PL by the motor 18 and finely moved in the light axis direction (Z direction). The wafer stage WS is also adapted to be 2-dimensionally moved by a step and repeat system. When a transfer exposure of the reticle R for one shot area on the wafer W is finished, it is moved to the next shot position by stepping. The structure of the wafer stage WS has been disclosed, for example, in U.S. Pat. No. 4,770,531. A movable mirror 19 for reflecting the laser beam from the interferometer 17 is fixed at the end part of the wafer stage WS and a 2-dimensional position of the wafer stage WS is always detected by the interferometer 17 with a resolution of, for example, approximately 0.01 µm.

A photoelectric sensor 33 is provided as an irradiation quantity monitor at a position approximately as high as the surface of the wafer W on the wafer stage WS. The photoelectric sensor 33 comprises a photoelectric transducer element provided with a light receiving area approximately as large as the image field of the projection optical system or the projection area of the reticle pattern and outputs the optical information related to the irradiation quantity to main controller 50. This optical information is the basic data for obtaining variations (aberration quantity) of the imaging characteristics corresponding to an energy quantity stored in the projection optical system PL in accordance with incidence of the illuminating light.

In addition, a wafer position detection system, which comprises an irradiation optical system 30 for slantly irradiating an imaging light flux for forming an image of pin hole or slit in reference to the light axis AX, and a receiving optical system 31 for receiving the imaging light flux reflected from the wafer W through the slit, is provided toward a best imaging plane of the projection optical system PL in FIG. 1. The structure of this wafer position detection system has been disclosed, for example, in the U.S. Pat. No. 4,650,983 and the wafer position detection system is used to detect a position of a wafer surface in a vertical direction (Z direction) in reference to the imaging plane, and to drive the wafer stage WS in the Z direction so that a specified distance may be kept between the wafer W and the projection optical system.

For this embodiment, it is assumed that an angle of a plan parallel glass (not shown) provided in advance in the receiving optical system 31 and calibration of the wafer position detection system is carried out so that the imaging plane serves as a reference zero point. In addition, it is also assumed that the optical system is arranged so that an inclination of the specified area on the wafer W to the imaging plane may be detected by using, for example, a horizontal position detection system as disclosed in the U.S. Pat. No. 4,558,949 or providing a wafer position detection system so that the focusing position may be detected at a plurality of desired positions in the image field of the projection optical system PL (for example, forming a plurality of slit images in the image field).

In the embodiment of FIG. 1, the a main controller 50 controls the overall operation of the apparatus. Also provided are a bar code reader 52 which reads a bar coded name BC beside a reticle pattern while the reticle R is transferred to a position right above the projection optical system PL, a keyboard 51 for entering commands and data from the operator, and the drive system 54 which comprises a motor for driving the holding member 7, to which a plurality of fly pupil lens groups including the fly pupil lens group 7A are mounted and a gear train. The names of a plurality of reticles to be treated in this projection exposure apparatus (for example, a stepper) and the operating parameters of the stepper corresponding to these names are registered in advance din the main controller 50. When the bar code reader 52 reads the bar code of the reticle R, one fly pupil lens group most suited to the pre-registered illuminating conditions (corresponding to the type of reticle, the cyclicity of the reticle pattern, etc.) is selected from those on the holding member 7, and the main controller outputs a specified drive command to the drive system 54. The main controller 50 has a calculator which calculates a quantity of compensation of the imaging characteristics of the projection optical system and a memory for storing operating parameters as described later.

In addition, calculation parameters (described later in detail) to be used to compensate the optimum setting conditions of the variable aperture diaphragms 8 and 32 and the variable blind 10 and the imaging characteristics of the projection optical system PL by the compensating mechanism (described later) are registered for the fly pupil lens group which has been previously selected, and these conditions are simultaneously set with the fly pupil lens group. Thus the optimum illuminating conditions can be set for the reticle R mounted on the reticle stage RS. The above operation can be executed according to the commands and data directly entered from the keyboard 51 into the main controller 50 by the operator.

A compensating mechanism for (adjusting device) the imaging characteristics of the projection optical system PL is described below. As shown in FIG. 1, the present embodiment is adapted to permit compensation of the imaging characteristics by independently driving the reticle R and the lens element 20 (21, 22) by a driving element control section 53. The imaging characteristics of the projection optical system PL include the focusing position, projecting magnification, distortion, warping of the imaging plane, astigmatism, etc. and these values can be individually compensated. In this embodiment, however, the compensation of the focusing position, projecting magnification, distortion and warping of the imaging plane in the two side telecentric projection optical system is considered hereinafter to simplify the description. In this embodiment, a barrel type or a bobbin type distortion is compensated by moving the reticle R.

The lens element 20 of the first group provided nearest to the reticle R is fixed to a support member 24 and the lens elements 21, 22 of the second group are integrally fixed to the support member 26. The lens element 23 and following lens elements are fixed to the body tube 28 of the projection optical system PL. The light axis AX of the projection optical system shall mean the optical axis of the lens elements fixed to the body tube 28.

The support member 24 is coupled to the support member 26 with a plurality of expandable driving elements 25 (for example, three elements; two elements are shown in FIG. 1) and the support member 26 is coupled to the body tube 28 with a plurality of expandable driving elements 27. For example, an electric distortion element or a magnetic distortion element is used as driving elements 25, 27, and 29, and a displacement of the driving element in response to a voltage or a magnetic field to be applied to the driving element is obtained in advance. Though not shown here, taking into account a hysteresis characteristic of the driving element, a position detector such as a capacitive displacement sensor or a differential transformer is provided in the driving element to enable high precision driving by monitoring the position of the driving element in response to a voltage or a magnetic field to be applied to the driving element.

When the lens elements 20, 21 and 22 are moved in parallel in the direction of the light axis, the projecting magnification M, imaging plane warp C and focusing position F vary in a variation ratio corresponding to the amount of movement. Assuming that the driving amount of the lens element 20 is $x_1$ and the driving amount of lens elements 21 and 22 is $x_2$, variations $\Delta M$, $\Delta C$ and $\Delta F$ of the projecting magnification M, imaging plane warp C and focusing position F are respectively denoted by the equation given below.

$$\Delta M = C_{M1} \times x_1 + C_{M2} \times x_2 \quad (1)$$

$$\Delta C = C_{C1} \times x_1 + C_{C2} \times x_2 \quad (2)$$

$$\Delta F = C_{F1} \times x_1 + C_{F2} \times x_2 \quad (3)$$

$C_{M1}$, $C_{M2}$, $C_{C1}$, $C_{C2}$, $C_{F1}$, and $C_{F2}$ are respectively the constants which indicate the ratios of variations to the driving amounts of the lens elements.

As described above, the wafer position detection system 30, 31 is used to detect an amount of deviation of the wafer surface from the optimum focusing position in reference to the optimum focusing position of the projection optical system PL as the zero point. Accordingly, if an electrically or optically appropriate offset value $x_3$ is given to the wafer position detection system, a deviation of the focusing position along with driving of the lens element 20 (21, 22) can be compensated by positioning the wafer by using the wafer position detection system. In this case, equation (4) can be expressed as given below.

$$\Delta F = C_{F1} \times x_1 + C_{F2} \times x_2 + x_3 \quad (4)$$

Similarly, when the reticle R is moved in parallel in the light axis direction, the distortion D and the focusing position F change in the ratio of variation corresponding to the amount of movement. Assuming the driving amount of the reticle R as $x_4$, variations $\Delta D$ and $\Delta F$ of distortion D and focusing position F are expressed as given below.

$$\Delta D = C_{D4} \times x_4 \quad (5)$$

$$\Delta F = C_{F1} \times x_1 + C_{F2} \times x_2 + X_3 + C_{F4} \times x_4 \quad (6)$$

$C_{D4}$ and $C_{F4}$ are the constants which denote the ratios of variations to the driving amount of the reticle R.

From the above, variations $\Delta M$, $\Delta C$, $\Delta D$ and $\Delta F$ can be compensated as required by setting the driving amounts $x_1$ to $x_4$ in equations (1), (2), (5) and (6). The above has described as to simultaneous compensation of four types of imaging characteristics. If variations of the imaging characteristics due to absorption of the illuminating light of projection optical system are negligible, the above compensation is not required. Compensation is required for the imaging characteristics other than the four types described in this embodiment if their variations are large. In addition, if the variation of the imaging plane warp is compensated to zero or an allowable value or less, the variation of astigmatism is also compensated accordingly to zero or an allowable value or less and, in this embodiment, therefore, compensation of the astigmatism need not be conducted in particular.

In this embodiment, the variation $\Delta F$ (equation (6)) of the focusing positions is given as an electrical or optical offset value to, for example, the wafer position detection system 30, 31. The surface of wafer W is set to the best imaging plane (best focus position) of the projection optical system PL by using the wafer position detection system to move the wafer W in the Z direction. In this embodiment, an example of compensation by moving the reticle R and the lens element is shown as the imaging characteristics compensation mechanism. Any type of compensation mechanism can be deemed appropriate for this embodiment; for example, a method for tightly sealing a space between two lens elements and adjusting the pressure in this sealed space can be used.

In this embodiment, reticle R and the lens element 20 (21, 22) can be moved by the driving element control section 53. Particularly, the effects on the characteristics such as the projecting magnification, distortion and imaging plane warp (astigmatism) of the lens element 20 (21, 22) are large as compared with other characteristics, and the control is easy. Though there are arranged two movable lens element groups in this embodiment, three or more lens element groups can be used. In this case, the movable range of a lens element can be expanded while controlling variations of other aberrations and, moreover, such compensation is applicable to various types of distortions (trapezoidal distortion, rhombic distortion) and the imaging plane warp (astigmatism). The compensating mechanism with the above arrangement is able to fully cover the variations of the imaging characteristics of the projection optical system PL due to absorption of the exposure light.

The arrangement described above permits the driving element control section 53 to independently move two groups of lens element 20 and lens elements 21 and 22 and three or four peripheral points of the reticle R as much as an amount specified by the driving command from the main controller 50 in the light axis direction. Consequently, two groups of lens elements 20 (21, 22) and the reticle R can be moved in parallel and tilted in any direction in a plane normal to the light axis AX.

The problems of the prior art are described again in detail as follows. In the case that the phase-shifted reticle is used as described earlier, the light intensity distribution at the pupil plane Ep of the projection optical system largely differs from the light intensity distribution of the normal reticle. This is described in detail referring to FIGS. 2A to 2F. FIGS. 2A to 2F show the formation of a pattern image and the light intensity distribution at the pupil plane when the light flux IL has a specified range of incident angle $\theta 1$ (corresponding to the $\rho$ value) for the reticle. A normal reticle is used in FIGS. 2A and 2D, a space frequency modulation type phase-shifted reticle is used FIGS. 2B and 2E, and a mixed reticle having the normal pattern and the phase-shifted pattern in FIGS. 2C and 2F.

Figure 2A:
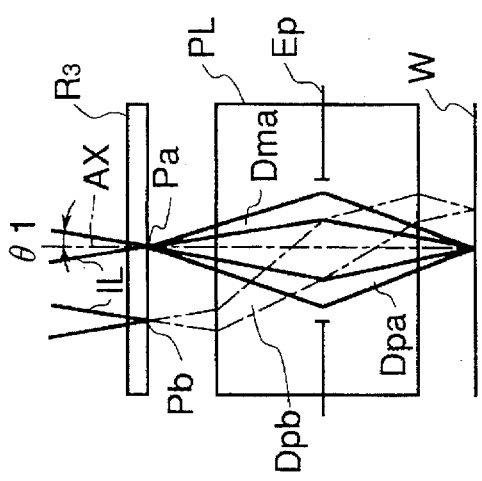
FIGS. 2A to 2F are illustrations of light intensity distributions of the projection exposure system for each reticle pattern.
Figure 2B:
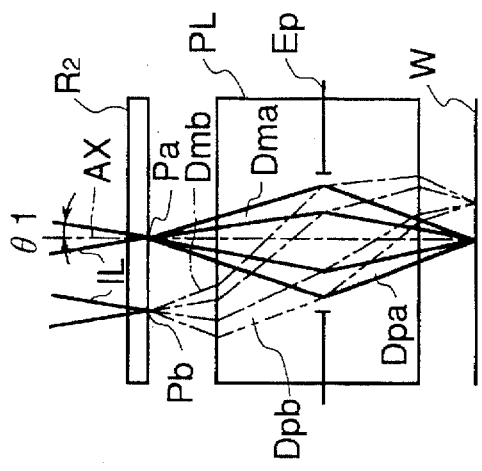
Figure 2C:
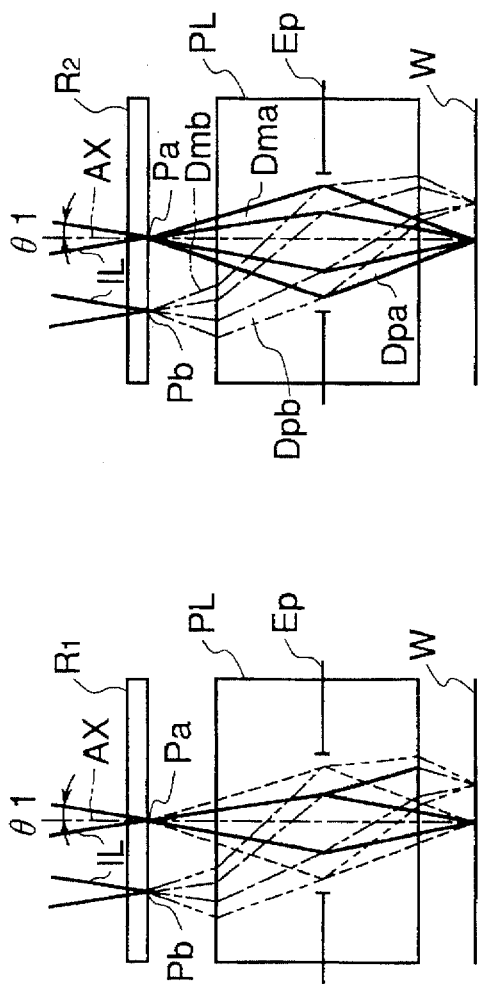
Figure 2D:
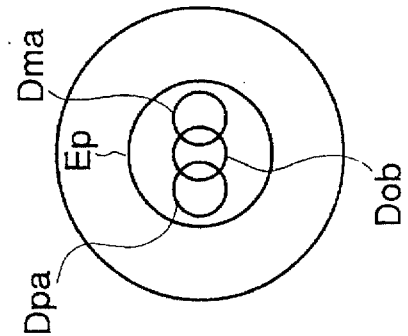

In FIGS. 2A and 2D, a zero-order light $D_{oa}$ (solid line) and $\pm$ primary diffracted lights $D_{pa}$ and $D_{ma}$ (dotted) are generated from point Pa on the normal reticle $R_1$ and form an image on the wafer W. Similarly, a zero-order light $D_{ob}$ (one-dotted broken line) and $\pm$ primary diffractive lights $D_{ob}$ and $D_{mb}$ (2-dotted broken line) are generated from point Pb on the reticle $R_1$ and form an image on the wafer W. In this case, zero-order lights $D_{oa}$ and $D_{ob}$ from the reticle pattern pass nearby the light axis AX at the pupil plane Ep of the projection optical system PL. When the reticle pattern is a one-dimension line and space pattern, the $\pm$ primary diffractive lights ($D_{pa}$ and $D_{pb}$), ($D_{ma}$ and $D_{mb}$) pass through a partial area symmetrical to the light axis AX.

Figure 2E:
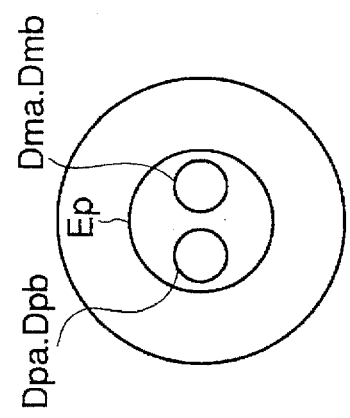
Figure 3A:
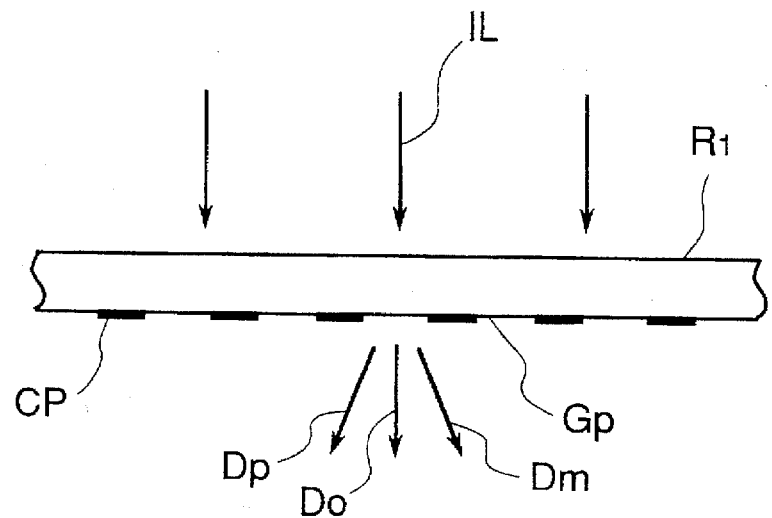
FIGS. 3A and 3B are illustrations showing a difference between an ordinary reticle and a phase-shifted pattern.

The following describes the case of a phase-shifted reticle as shown in FIGS. 2B and 2E. Diffracted light generated from the pattern of the phase-shifted reticle differs from that from the normal pattern. This is described referring to FIGS. 3A and 3B. When the illuminating light IL is directed to be approximately perpendicular to the one-dimensional line and space pattern (CP, GP) on the normal reticle $R_1$ as shown in FIG. 3A, a zero-order light $D_o$ and $\pm$ first-order diffractive lights $D_p$ and $D_m$ are generated from the pattern. On the other hand, on the space frequency modulation type phase-shifted reticle $R_2$ shown in FIG. 3B, phase shifters PS which shift the phase of a transmitted light as much as $\rho$ [rad] are mounted on every other transmitting part GP. Accordingly, when the incidence of the illuminating light IL onto the reticle R2 is approximately perpendicular to the pattern, only $\pm$ first-order diffracted lights $D_p$ and $D_m$ are generated from the patterns (CP, GP, PS).

Figure 3B:
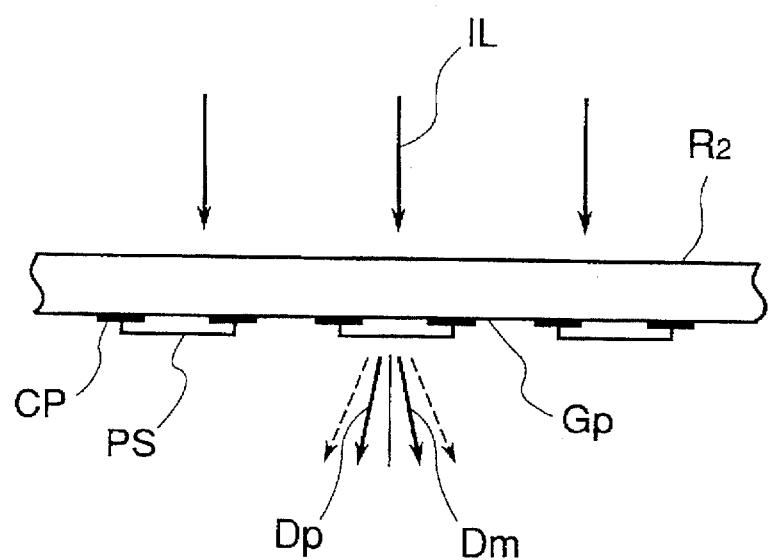

Assuming that the shielding parts CP shown in FIGS. 3A and 3B are provided at the same pitch, the $\pm$ first-order diffracted lights $D_p$ and $D_m$ (solid line) generated from the phase-shifted reticle $R_2$ in FIG. 3B are generated inwardly (with less divergence) relative to first-order diffracted lights (dotted line) generated from a normal reticle. In other words, the angle of diffraction on the phase-shifted reticle is smaller than the angle of diffraction on the normal reticle. This makes it possible to resolve a more precise pattern on the phase-shifted reticle than with the normal reticle since the ± first-order diffracted lights from an appropriate pattern may pass through the pupil plane of the projection optical system even though the pattern on the phase-shifted reticle is more precise than that on the normal reticle.

In FIG. 2B, the ± first-order diffracted lights $D_{pa}$ and $D_{ma}$ (solid line) are generated from the point Pa on the phase-shifted reticle $R_2$ and the ± first-order diffracted lights $D_{pb}$ and $D_{mb}$ (one-dotted broken line) are generated from the point $P_b$. Thus, only the ± first-order diffracted lights ($D_{pa}$, $D_{pb}$) from the reticle pattern are entered into the projection optical system PL and pass through a partial area approximately symmetrical to the light axis AX in the pupil plane EP.

As will be appreciated from FIGS. 2A, 2D, 2B, and 2E, there is a large difference of the light intensity distribution on the pupil plane $E_p$ of the projection optical system PL between the normal reticle and the phase-shifted reticle. Therefore, if the aberrations in the projection optical system are the same, not depending on the light flux passing positions in the optical system, there will be no problems even though the light intensity distribution on the pupil plane varies. However, if there is even a small difference, the imaging characteristics of the projection optical system PL, for example, the focusing position and the projecting magnification, differ with the light intensity distribution on the pupil plane. This is described referring to FIGS. 4 and 5.

Figure 4:
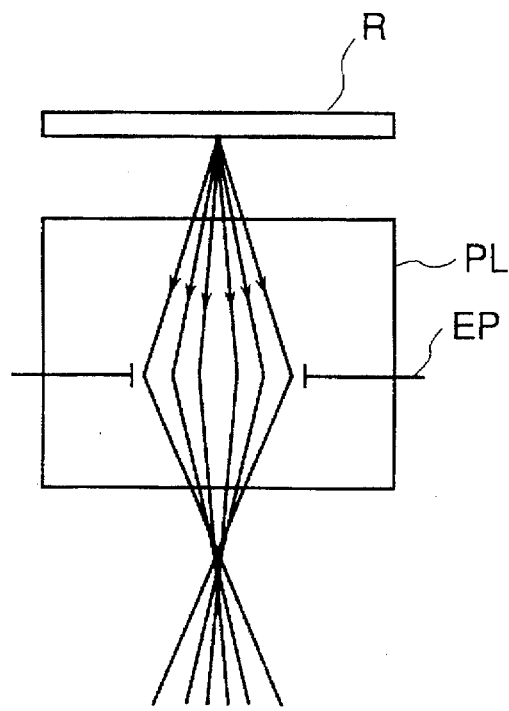
FIG. 4 is a diagram illustrating a spherical aberration of the projection optical system.
Figure 5:
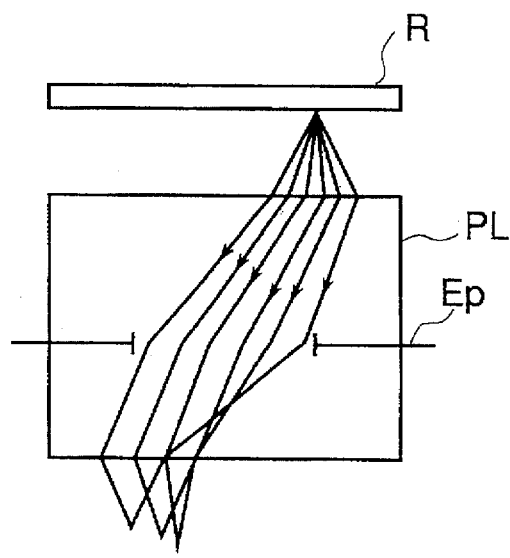
FIG. 5 is a diagram illustrating coma aberration of the projection optical system.

FIG. 4 shows that the projection optical system PL has a spherical aberration and the focusing position varies with the positions of light fluxes which pass through the pupil plane $E_p$. FIG. 5 shows that the projection optical system PL has a coma aberration and the projecting magnification and the focusing position differ with the positions of light fluxes which pass through the pupil plane $E_p$. Though the spherical aberration and the coma aberration are satisfactorily compensated in the projection optical system PL, they cannot be completely eliminated and will partly remain. Therefore, if the light intensity distributions at the pupil plane Ep differ each other, the focusing positions and projecting magnifications with respect to the respective distributions differ.

If internal temperatures of lens elements which form the projection optical system PL are the same, variations of the imaging characteristics (focusing position, projecting magnification, etc.) due to various types of aberrations are not remarkable. However, if a temperature distribution (gradient) occurs in the projection optical system due to absorption of the exposure light, the illumination light fluxes are differently affected by the temperature, depending on their passing positions, and the changes of the imaging characteristics due to various types of aberrations are large. This problem cannot be controlled by modification of the optical design and other adjustments and can be controlled only by improving the transmissivity of the lens elements (quartz). Currently the transmissivity has reached the limit. As a measure, it is determined as to whether the reticle R is a normal reticle or a phase-shifted reticle by entering the type of reticle through, for example, the keyboard by the operation or by reading a bar code BC on the reticle R by the bar code reader In addition, a method is assumed in that the main controller 50 calculates the variations of the imaging characteristics due to various types of aberration in response to the type of reticle and the calculated variations are given to the control section to compensate the imaging characteristics. Accordingly, even though various types of aberrations still remain in the projecting optical system PL, the variations of the imaging characteristics due to a difference of the light intensity distribution on the reticle, and thus, the pupil plane Ep of the projection optical system PL, can be solved without any problem.

Figure 2F:
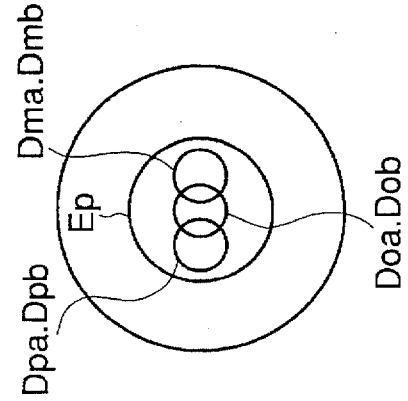

However, a problem is found in the case that the phase-shifted pattern and the normal pattern coexist on one reticle. As was explained in connection with FIGS. 2A, 2D and 2B, 2E, the normal pattern and the phase-shifted pattern have respective light intensity distributions (distribution states of imaging beams) on the pupil plane that are largely different from each other. The light intensity distribution on the pupil plane $E_p$ of the projection optical system PL in this case is shown in FIGS. 2C and 2F. In FIGS. 2C and 2F, it is assumed that a phase-shifted pattern is formed on the point $P_a$ on the mixed reticle $R_3$ and a normal pattern is formed at point $P_b$. Accordingly, it is assumed that only ± one-dimensional diffractive lights $D_{pa}$ and $D_{ma}$ are generated from the point $P_a$ and the zero-order diffracted light (not shown) is generated from the point $P_b$. In this case, because the aberrations of the projection optical system PL cannot be ignored as described above, there will be a problem that the focusing position or the projecting magnification differs between the phase-shifted pattern ($P_a$) and the normal pattern ($P_b$).

Figure 6:
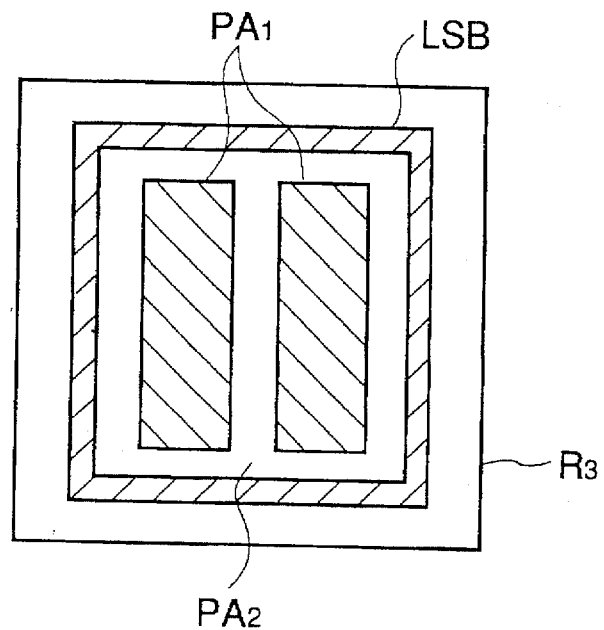
FIG. 6 is an example of structure of a mixed reticle.

The mixed reticle as described above is arranged so that, of various patterns to be formed on the same reticle, only particularly precise patterns are formed as phase-shifted patterns and remaining coarse patterns are formed as normal patterns for reasons of minimizing cost and difficulty in inspection in the case of the phase-shifted pattern. Referring to FIG. 6, for example, in some cases for forming two memories in the exposure area, a memory cell part (two pattern areas shown as hatched) $PA_1$ is formed as a phase-shifted pattern and a wiring part (pattern area) $PA_2$ outside the memory cell part is formed as a normal pattern, in the pattern forming area surrounded by a light shielding band LSB. In addition, for using the phase-shifted pattern, the incidence angle range $\theta_1$ that is, the a value of the illuminating light in FIGS. 2B and 2E is set as a small value in order to increase a normal coherency. Specifically, the ρ value is set to be approximately 0.1 to 0.4. In this case, the light path difference between the phase-shifted pattern $PA_1$ and the normal pattern $PA_2$ becomes larger and the effect of the aberrations of the projection optical system PL shows a large difference.

As described above, the present invention enables exposure of all types of patterns under satisfactory imaging characteristics. The mixed reticle from which the above-described problem may arise is not limited to a combination of the space frequency modulation type phase-shifted pattern and the normal pattern. For example, even in the case of a reticle comprising only a normal pattern, the angle of the diffracted light generated from the pattern varies with the preciseness of the pattern (line width, pitch, etc.). Therefore, if a plurality of patterns which have different precisenesses are provided, a similar problem to the above will arise because there still remains a degree of difference. In the following embodiments, the description is given as to the mixed reticle having the phase-shifted pattern and the normal pattern. However, the above problem can be solved in the same manner in the case of a mixed reticle including a plurality of normal patterns with different preciseness.

Next, an alignment operation according to an embodiment of the present invention is described in conjunction with FIG. 1. First, in this embodiment, an aligner body (main controller 50) should be notified of formation conditions for a reticle R that is loaded on a reticle stage RS. For this purpose, an operator enters the formation conditions for the reticle to the main controller 50 through a keyboard (input device) 51. Alternatively, the main controller 50 can receive a reticle name or the formation conditions therefor indicated by a bar code BC through the bar code reader 52. When the reticle name is to be indicated by the bar code BC, a memory in the main controller 50 stores, in a form of a table, the formation conditions therefor in association with the reticle name.

The formation conditions to be supplied to the main controller 50 may include a type of reticle pattern and combinations thereof, as well as a preciseness, a rule of design, combinations thereof or the like. The main controller 50 determines (sets) an optimum illuminating condition (such as a ρ value) for the reticle R according to the formation conditions entered. In addition, optimum correction values are calculated for a focusing characteristic of the projection optical system PL such as a focusing position, a projection magnification and aberrations (deformation of image surfaces, image deformation or the like) according to the set illuminating conditions, the formation conditions for the reticle R and a process factor of a wafer. Hereinafter, a method of calculating these correction values is described with the focusing position being used as an example. However, the same principles can be applied to the projection magnification and aberrations. In addition, it is assumed that a mixed reticle (FIG. 6) is used in which a phase shifted pattern and a normal pattern are exhibited.

The main controller 50 stores previously in its memory a characteristic of a spherical aberration (corresponding to FIG. 4) of the projection optical system PL in a form of a mathematical equation or a table. In response to reception of the formation conditions for the reticle, the main controller 50 determines an optimum focusing position B.F. of the projection optical system PL for the mixed reticle in FIG. 6. This is described in detail with reference to FIG. 7.

First, the main controller 50 calculates a light intensity distribution on a pupil plane Ep of the projection optical system PL for each pattern region on the reticle according to the formation conditions for the reticle and the illuminating conditions (ρ value) optimum for that reticle pattern. In addition, the main controller 50 calculates the focusing position for each pattern according to the light intensity distribution and the equation representing the spherical aberration characteristic or the table. More specifically, the main controller 50 calculates a focusing position Za for a pattern area (memory cell portion) $PA_1$ and a focusing position Zb for a pattern area (wiring portion) $PA_2$. Since the positions Za and Zb are different, it is apparent that respective focusing errors of the two pattern images are different. Further, the main controller 50 stores previously in its memory, in a form of a mathematical equation or a table, a practical focal depth determined depending on the illuminating conditions, the type or the preciseness of the reticle patterns to calculate focal depths ZDa and ZDb for the pattern areas $PA_1$ and $PA_2$, respectively, in a similar manner as for the focusing positions.

Figure 7:
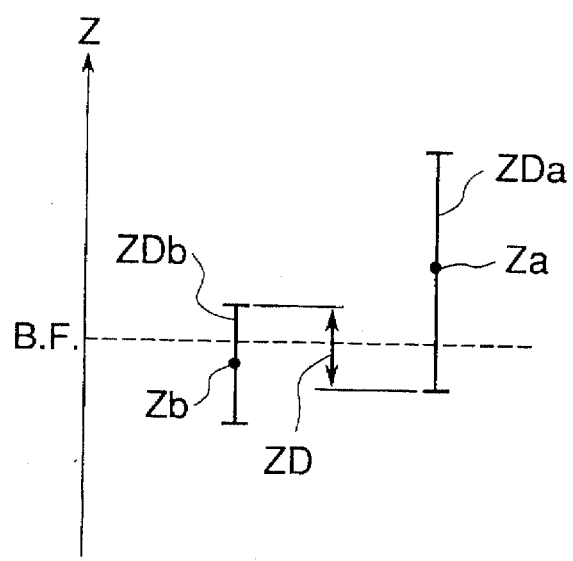
FIG. 7 is a diagram illustrating a method for determining a focusing position suitable both for the normal pattern and for the phase-shifted pattern on the mixed reticle.

Next, the main control device 50 determines the optimum focusing position B.F. of the mixed reticle according to the focusing positions Za and Zb as well as the focal depth ZDa and ZDb for each pattern area. As shown in FIG. 7, the focusing positions Za and Zb are not coincident with each other for the memory cell portion $PA_1$ and the wiring portion $PA_2$, but the focal depth ZDa is partially overlapped with ZDb. More specifically, a region ZD where the focal depth ZDa overlaps with the ZDb becomes an effective focal depth of the mixed reticle. Thus, in this embodiment, an intermediate point of the focal depth ZD relative to a Z direction (direction along the optical axis) is determined as the optimum focusing position B.F. for the mixed reticle.

Thereafter, the main controller 50 inclines a parallel plate glass in a photosensitive optical system such that the focusing position B.F. comes to a zero point reference for wafer position detection system 30, 31 to carry out calibration of the wafer position detection system. Focusing operation is performed by using the wafer position detection system for every shot area on a wafer W, which permits the entire surface of the shot area to be set within the focal depth of the projection optical system PL even when the mixed reticle is used. In other words, pattern images of either the memory cell portion PA1 or the wiring portion PA2 on the mixed reticle can be focused well on the shot area.

In the above description, the intermediate point of the focal depth ZD is determined as the optimum focusing position B.F. However, any point can be set as the optimum focusing position B.F. as long as it is located within the focal depth ZD. For example, the optimum focusing point B.F. may be determined with some weight within the focal depth ZD depending on significance (preciseness) of each pattern area, a stair-shaped structure (unevenness) of the shot area and line widths of circuit patterns on the reticle. These pieces of information may be entered in the main controller 50 through the keyboard 51 or the bar code reader 52. In addition, if the memory cell portion $PA_1$ is formed of phase-shifted patterns and the focal depth thereof is significantly large, and when the wiring portion $PA_2$ is located within the range thereof, the optimum focusing position B.F. may be determined considering only the wiring portion $PA_2$ as, for example, the focusing position Zb of the wiring portion $PA_2$ is determined as the optimum focusing position B.F.

In the case of a plurality of pattern areas on the mixed reticle, the focal depth may not be a consideration in determining the optimum focusing position B.F. when, for example, the focal depth is significantly large or the pattern area is the one where focal depth can be neglected. In addition, while the mixed reticle shown in FIG. 6 comprises the memory cell portion $PA_1$ and the wiring portion $PA_1$, three or more kinds of pattern areas may be formed on the reticle. In such a case, the focusing characteristic (such as the focusing position) can be obtained through calculation in the same manner as described above. While in the above description the focusing characteristic for each pattern is obtained through calculation, considering the illumination conditions, the type of the reticle or the degree of the fineness (precision), the focusing characteristic for each pattern may be obtained only in accordance with, for example, the type of the reticle pattern, i.e., whether the reticle pattern is a phase-shift pattern or a normal pattern. Further, the focusing conditions depending on a combination of the focusing characteristic depending on the illuminating conditions, the type of the reticle and the degree of the fineness may be stored previously in the main controller 50 rather than calculating the focusing characteristic for each pattern. In such a case, the focusing characteristic of each combination is stored in the main controller 50 in association with the reticle name. The focusing characteristic associated with the reticle name is thus read out of the memory when the reticle name in question is received through the keyboard 51 or the bar code reader 52. In addition, the focusing characteristic to be supplied to the main controller 50 may be determined previously through experiments, i.e., a proof print. Alternatively, it may be obtained according to a simulation.

In this embodiment, the focusing characteristic for each pattern area is obtained through calculation by using all pieces of information regarding alignment and exposure of the mixed reticle (formation conditions for the mixed reticle), i.e., the illumination conditions, the type of the reticle pattern, the preciseness, cyclic properties, the process factor of the wafer, the stair-shaped structure in the shot area and the line width of the patterns. However, if it is difficult to supply all or most of formation conditions for the reticle to the main controller 50, or if the alignment can be achieved with an excellent focusing characteristic without so many formation conditions, the focusing characteristic such as the optimum focusing position may be obtained according to the information for three categories of, for example, the phase shifted reticle, the normal reticle and the mixed reticle. More specifically, in the mixed reticle, an intermediate point between the focusing positions of the representative phase-shifted pattern and the representative normal pattern may be determined as the optimum focusing position B.F. In this event, the representative phase-shifted pattern may be a phase-shifted pattern having the smallest focal depth of the phase-shifted patterns having different preciseness or cyclic properties on the mixed reticle. This is also true for the normal pattern.

Along with the above mentioned formation conditions for the mixed reticle, items such as an allowable focus error or a magnification difference may be entered if more detailed information can be supplied to the main controller 50. The optimum focusing position may be determined using these pieces of information as well. The term allowable focus error used herein means the error obtained from formed states of the patterns formed on the wafer after the reticle pattern is exposed several times with the wafer moved by a predetermined amount in the Z direction (following which it is developed and subjected to an etching processing), which corresponds to the focal range required for obtaining circuit patterns which meet various characteristics required. With this, such optimum focusing position and the focal depth can be obtained that are suitable for the actual process. Instead of the above mentioned proof print, the allowable focus error may be obtained through simulations. In addition, a tolerance of the allowable magnification difference may be obtained in a similar manner as for the above mentioned focus error according to a degree (area) of overlap between the circuit patterns and the reticle patterns on the wafer through the proof print or simulations.

While the above thus description has thus been made only in conjunction with the focusing position of the projection optical system PL, a correction amount for the projection magnification may be obtained according to the projection magnification (error) for each pattern in the same manner as described above. According to this correction amount, the magnification of the projection optical system PL may be adjusted by finely moving at least one of lens elements 20 (21 and 22) through control section 53. More specifically, the main controller 50 calculates the projection magnification for each of the memory cell portion $PA_1$ and the wiring portion $PA_2$ in FIG. 6 according to an equation representing a characteristic of coma aberration (FIG. 5) and the light intensity distribution on the pupil plane Ep of the projection optical system PL for each pattern area on the mixed reticle. In addition, the main controller 50 determines the previously calculated projection magnification and, if necessary, the correction amount (or the optimum projection magnification) for the projection magnification of the projection optical system PL according to the line width of the circuit patterns on the wafer such that an initial value of the projection magnification (such as ⅕) or the magnification error of the projected images for the circuit patterns already formed in the shot area on the wafer do not exceed predetermined allowable values in each of the memory cell portion $PA_1$ and the wiring portion $PA_2$. Thereafter, the main controller so supplies this determined correction amount to the control section 53. The control section 53 adjusts the magnification by finely moving at least one of the lens elements 20 (21 and 22) depending on the correction amount. As a result, the images of all patterns on the mixed reticle can be focused and projected on the shot area on the wafer W at a satisfactory level of the magnification.

A correction amount for a deformation aberration may also be obtained according to image deformation in each pattern area calculated according to the light intensity distribution in the pupil plane of the projection optical system as well as the equation representing the characteristic of the deformation aberration to adjust the deformation aberration along with the magnification error by the control section 53. Typically, the pattern image in the memory cell portions $PA_1$ is finer than that in the wiring portion $PA_2$ on the wafer W, so that the above mentioned magnification error or the image deformation may not be neglected for the memory cell portion $PA_1$ even if they are in such degree that they can be neglected for the wiring portion $PA_2$. To adjust the magnification error and the deformation aberration, the pattern area where the pattern images on the wafer are the finest for the pattern areas on the mixed reticle is taken into consideration. The only requirement is to determine correction amounts for the magnification error and the deformation aberration such that the magnification error and the image deformation in the this particular pattern area do not exceed the allowable values. The correction amounts for the magnification error and the deformation aberration may be determined, only when the magnification error and the image deformation exceed the allowable values outside the directed pattern area, such that the magnification error and the image deformation do not exceed in both the pattern area in question and the directed pattern area.

In the above mentioned description, it is not considered that the focusing characteristic of the projection optical system PL varies due to exposure light absorption. More specifically, the above mentioned description has been made in connection with a case where the projection aligner is in the initial condition. However, the focusing characteristic (aberration conditions) of the projection optical system PL varies overtime due to the exposure light absorption. Hereinafter, an exemplary operation for such a case is described, in which description is made with the focusing position of the focusing characteristics of the projection optical system PL used as an example.

Figure 8:
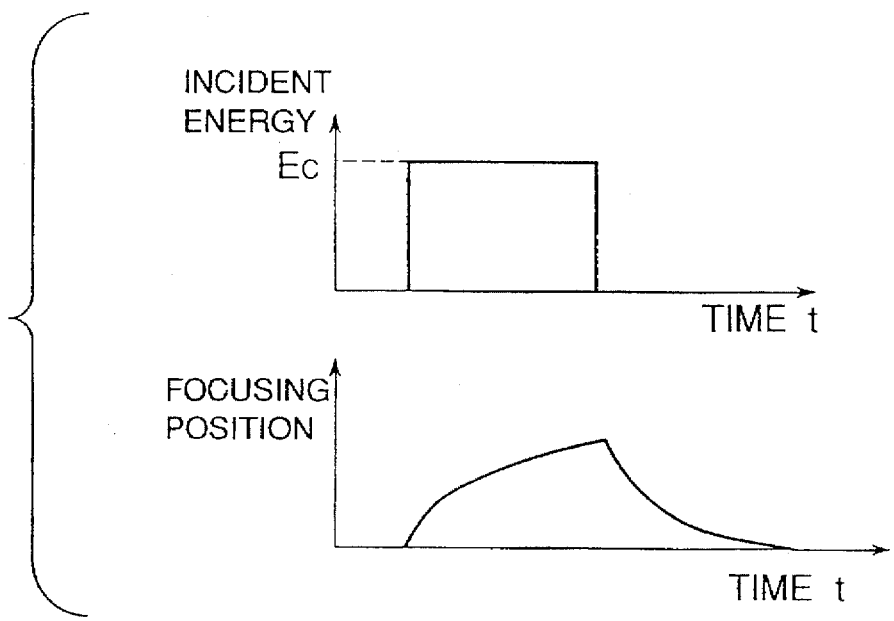
FIG. 8 is a diagram illustrating a change of the focusing position due to absorption of the exposure light of the projection optical system.

First, typical variation of the focusing position is shown in FIG. 8. In FIG. 8, the focusing position varies with delay due to a time lag accompanying a process of temperature rise due to exposure light (thermal) absorption when an exposure light having a constant energy of Ec is directed to the projection optical system PL during a predetermined time. This delay can be represented by a linear differential equation. In the projection aligner, this characteristic (equation) is stored previously in the main controller 50 and a current optimum focusing position is obtained by calculating a change amount of the focusing position through constant monitoring of the incident energy to the projection optical system PL.

More specifically, the energy amount directed to the projection optical system PL is measured by using a photoelectric sensor 33 disposed on a wafer stage WS at every time of replacement of the reticle R or of changing settings of a variable blind 10, i.e., at every time when the energy amount (light quantity) directed to the projection optical system PL is changed. Alternatively, the above mentioned relation is stored (registered) during previous measurements. In addition, the energy amount directed from the wafer W to the projection optical system PL, i.e., a reflected light amount is measured by using the photoelectric converting element 38. The main controller 50 receives photoelectric signals supplied from the photoelectric sensor 33 and the photoelectric converting element 38 as well as open-and-close information for the shutter 3. The main controller 50 solves the above mentioned differential equation through a sequential numerical solving method to calculate change in the focusing position.

The light intensity distribution of the normal reticle is extremely different from that of the phase shifted reticle on the pupil plane Ep of the projection optical system PL as shown in FIGS. 2A and 2B. The changing characteristics on the focusing position are thus different from each other rather than being equal to each other. Accordingly, parameters for the equation representing the change characteristics of the focusing position may be varied depending on the type of the reticle. However, problems are presented in the case of a mixed reticle where both types of pattern are present together as shown in FIGS. 2C and 2F. In the mixed reticle, there are problems that the changing characteristic of the focusing position is varied depending on an existence rate of the phase shifted pattern and the normal pattern and that the changing characteristics of them are different from each other.

In the present embodiment, a size (area) of each of the pattern areas on the mixed reticle is supplied to the main controller 50 along with the above mentioned formation conditions for the mixed reticle. With these pieces of information, the light intensity distribution on the pupil plane Ep of the projection optical system with the mixed reticle is calculated in the same manner as described above. For example, if a total area of the area where the phase shifted patterns are formed is larger than the total area of the area where the normal patterns are formed, the intensity of light at the central portion of the pupil plane Ep shown in FIGS. 2C and 2F is lower than that in a case where the total area of the normal patterns is larger than the total area of the phase shifted patterns. By means of accurately obtaining the light intensity distribution on the pupil plane Ep of the mixed reticle, it becomes possible to predict the changing characteristic of the focusing position due to the light absorption. Accordingly, the main controller 50 calculates successively the focusing positions for the phase shifted patterns and the normal patterns according to the changing characteristic of the focusing position due to the light absorption. Then, the main controller 50 determines the optimum focusing position B.F. according to the calculated focusing position for each pattern area in the same manner as has been described above. Further, the main controller 50 finely moves the wafer stage WS through motor 17 in the direction of the optical axis according to the determined focusing position B.F. and detection signals supplied from the wafer position detection system 30, 31. As a result, the images of all patterns can be focused and projected on the shot area effectively even when the focusing position for each pattern area on the mixed reticle is moved due to the exposure light absorption.

Figure 9:
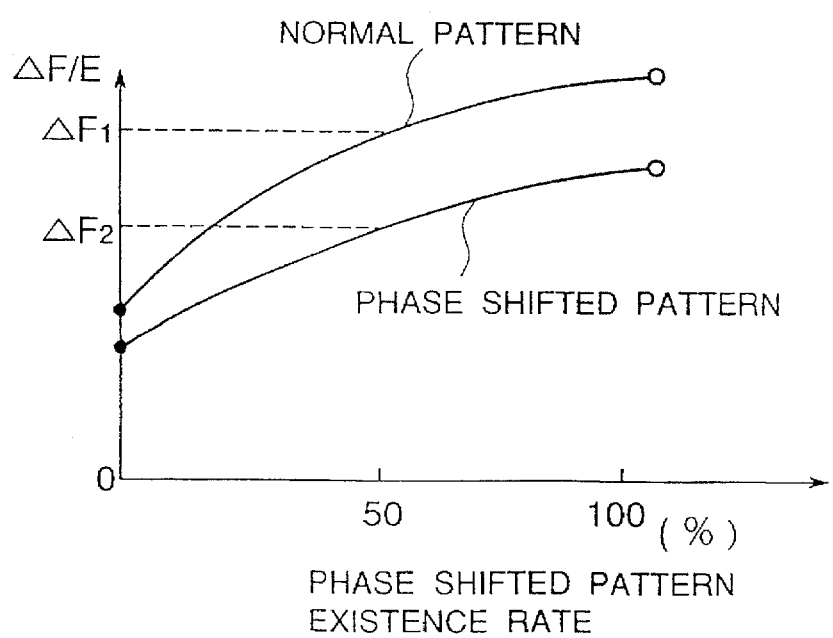
FIG. 9 is a diagram illustrating a variation characteristic of the focusing point on each of the normal pattern and the phase-shifted pattern.

The above mentioned process will now be explained in more detail. A parameter of the exposed light absorption is, for example, a change ratio $\Delta F/E$ (μm/W) of the focusing position per unit incident energy, or a parameter constant T (sec) of the degree of delay in change. These parameters may be stored previously in the main controller 50 in association with the area ratio of the phase shifted patterns. This is described with reference to FIG. 9. An abscissa in FIG. 9 represents an existence rate (area ratio) of the phase shifted patterns while an ordinate represents either the $\Delta F/E$ or T ($\Delta F/E$ in FIG. 9). When the mixed reticle comprises two kinds of the patterns, the phase shift patterns and the normal patterns, the abscissa in FIG. 9 may be the existence rate (area ratio) of the normal patterns.

In FIG. 9, a relation between the change rate $\Delta F/E$ and the existence rate of the patterns is different for the normal pattern and the phase shifted pattern. Accordingly, there are two characteristic curves representing the above mentioned relation. This is determined previously through optical simulations or experiments. In addition, if accuracy considerations do not dictate otherwise, only the end data may be obtained and the extension therebetween may be considered as a straight line (linear function). For example, when the existence rate of the phase shifted patterns is equal to 50%, the changing rate $\Delta F/E$ of the normal patterns in FIG. 9 becomes $\Delta F$, while the changing rate $\Delta F/E$ of the phase shifted patterns become $\Delta F_2$. Actual correction made in such a case is shown in FIG. 10.

Figure 10:
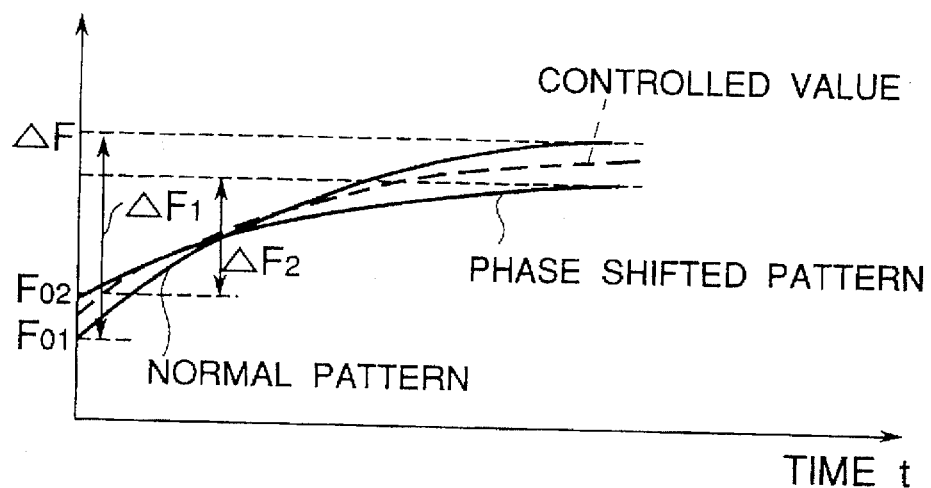
FIG. 10 is a diagram illustrating a method for determining an optimal focusing position of the normal pattern and the phase-shifted pattern when the focusing position is changed by absorption of the exposure light.

FIG. 10 illustrates change in the focusing point of the projection optical system due incidence of exposure energy.

In FIG. 10, a time 0 corresponds to a state where the projection optical system PL is cooled sufficiently and is in a stable condition. In practice, there is some unevenness due to stepping alignment or replacement of the wafers. However, a smooth curve is shown in FIG. 10 for the purpose of simplifying the figure. The normal pattern is different in the focusing point from the phase shifted pattern at the time instant 0, and this is represented by a distance between $F_{o1}$ and $F_{o2}$. After initiation of the alignment and exposure, they are different from each other in the changing amount, and they are changed along the curves as shown in FIG. 9. Accordingly, the main controller 50 calculates successively these changes and performs focusing operation by determining the intermediate point (dotted line) between them as the optimum focusing position. This method allows focusing and projection, at a satisfactory level, of the pattern images on the wafer even when the reticle used is the mixed reticle.

When the energy of the exposure light is excessively strong, the overlapped portion between the focal depth ZDa and ZDb in FIG. 7 may become too small. In such a case, alignment and exposure within the focal depth cannot be achieved due to unevenness of the wafer or a focusing position control error. In view of this, a certain reference value is set for the size of the overlapped portion. It is preferable that an alarm be generated when the overlapped portion becomes smaller than the reference size. In such a case, the alignment operation may be interrupted until the projection optical system is cooled, following which a sequence for restarting the alignment operation is automatically initiated. Alternatively, alignment interval may be previously adjusted or the alignment sequence may be modified such that the above mentioned overlapped portion does not become smaller than the reference size. This slightly degrades operability but eliminates a risk of defective products due to the focus displacement. The above mentioned reference value may be varied by means of entering conditions such as the line width of the patterns.

In the above mentioned embodiment, the focusing positions for the individual pattern areas on the mixed reticle are all calculated. However, the focusing position for each pattern area may be measured by using a focusing characteristic measurement system of, for example, a space image detection type. Described below is a method of correcting the focusing characteristic by using this measurement system.

Figure 11A:
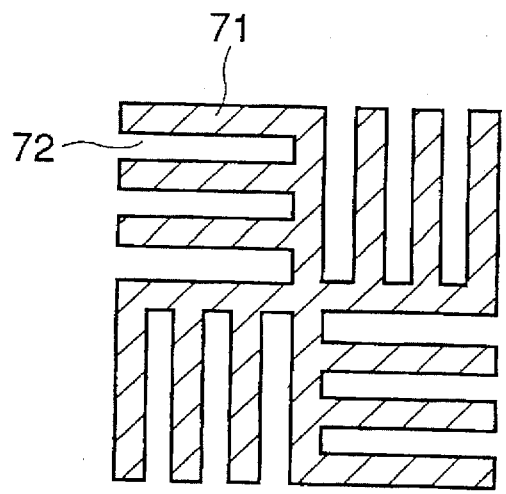
FIG. 11A is an example of an aperture pattern of the pattern plate in FIG. 1
Figure 11B:
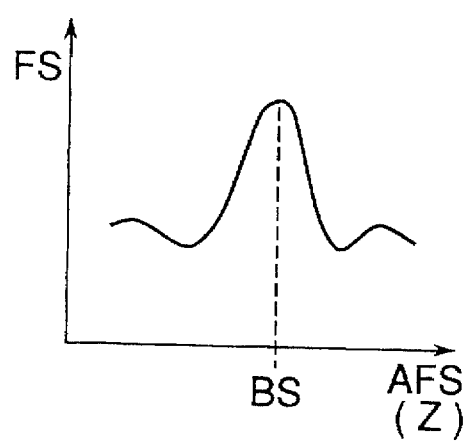
FIG. 11B is a diagram illustrating a photoelectric signal to be outputted from a photoelectric sensor in FIG. 1.

First, the focusing characteristic measurement system is described with reference to FIGS. 11A and 11B. As shown in FIG. 1, a pattern plate 15 is attached to a position closer to the wafer W on the wafer stage WS. An opening pattern is formed in the upper surface of the pattern plate 15. The opening pattern consists of, as shown in FIG. 11A, a blocking portion 71 and a light transmitting portion 72. The opening pattern comprises four diffraction lattices formed by means of rotating successively by 90° a diffraction lattice of an amplitude type consisting of line and space patterns at a predetermined pitch.

Turning back to FIG. 1, the pattern plate 15 is so secured to the wafer stage WS that the surface in which the opening pattern is formed is approximately coplanar to the surface of the wafer W in the Z direction. The pattern plate 15 is provided with an input and output unit 34 of the detecting illumination optical system at the lower portion thereof. In addition, by means of moving the wafer stage WS in an XY plane perpendicular to an optical axis AX of the projection optical system PL, the pattern plate 15 can be positioned at a center of the image field of the projection optical system or at a position having an arbitrary image height.

An illuminating light beam EL having the wavelengths identical to or close to that of an illuminating light beam IL for illuminating the reticle R is directed to one branch end 35a a fiber bundle 35. The illuminating light beam EL used may be, for example, one obtained by dividing a portion of the illuminating light beam IL by means of a beam splitter or the like. The illuminating light beam EL is directed to the input and output unit 34 in the wafer stage WS from the branch end 35a of the fiber bundle 35 through a joint end 35b. The illuminating light beam EL illuminates the opening pattern of the pattern plate 15 from below through the input and output unit 34 consisting of a relay lens, a field stop, a mirror and a condenser lens or the like. The light beam transmitted through the pattern plate 15 focuses the image of the opening pattern of the pattern plate 15 on a lower surface (pattern surface) of the reticle R through the projection optical system. The light beam reflected from the pattern surface of the reticle R goes back to the inside of the wafer stage WS through the projection optical system PL and the pattern plate 15. This reflected light is directed to the joint end 35b of the fiber bundle 35 through the optical path in the reverse order. The reflected light is then emitted out of the other branch end 35c of the fiber bundle 35 and is directed to a photoelectric sensor 36.

The photoelectric signal S output from the photoelectric sensor 36, which corresponds to the light quantity to which the reflected light from the pattern plane of the reticle R is limited by using the aperture pattern of the pattern plate 15, is supplied to the main controller 50. FIG. 11B illustrates the photoelectric signal FS output from the photoelectric sensor 36 when the pattern plate 15 is finely moved in the Z direction; the vertical axis indicates the signal level (a voltage value) and the horizontal axis indicates the output signal AFS of wafer position detection system 30, 31, that is, the position in the Z direction. The main controller 50 obtains the position BS in the Z direction at which the photoelectric signal FS is maximum as the optimum focusing position.

In this embodiment, with the use of the measuring system in the above arrangement, the aperture pattern of the pattern plate 15 is changed according to the type of the pattern on the mixed reticle. For example, a normal pattern and a phase-shifted pattern are previously formed on the pattern plate 15 as the above-mentioned aperture pattern. Then, after positioning the normal pattern and the phase-shifted pattern at the specified point (the projecting position of the respective pattern on the mixed reticle) in the image field of the projection optical system PL at unit time intervals or at each wafer replacement, the pattern plate 15 is finely moved in the Z direction to detect the optimum focusing position in the same manner as the above operation. This makes it possible to omit storing the equation which expresses the various types of aberration (particularly spherical aberration) of the projection optical system PL or variation characteristics as shown in FIG. 9. In this embodiment, after measuring each focusing position in the pattern areas on the mixed reticle by using the pattern plate 15, the optimum focusing position of the mixed reticle is determined in the same manner as earlier described so as to carry out focusing at each shot area according to the focusing position.

Preferably the conditions (for example, preciseness) on forming various types of the aperture pattern on the pattern plate 15 are identical with each pattern on the mixed reticle. Supposing that the projection optical system PL has projecting magnification M, however, the pattern pitch Pr on the pattern plate 15 is associated with the pattern pitch P on the mixed reticle in relationship Pr=M.P, for example. It is also preferable to set, on the pattern plate 15, a Fourier transformation plane for the aperture pattern in the illumination optical system for detection to which illuminating light EL is applied or light quantity distribution adjusting means around it so that the illuminating conditions for the pattern plate 15 can be changed. The light quantity distribution adjusting means can be either a variable aperture diaphragm mechanism or a replaceable aperture diaphragm mechanism. This makes it possible to match the illuminating conditions for the reticle R to those for the pattern plate 15. In other words, the light quantity distribution on the Fourier transformation plane in the illumination optical system for detection can be adjusted so as to substantially the same as the light quantity distribution in the pupil plane in the illumination optical system for exposure (5 to 13), which enhances the measuring accuracy of the focusing position.

In the above embodiments, the type of the pattern on the mixed reticle and the area of each pattern must be entered in the main controller 50. However, there can be a means for measuring them. For example, a removable optical sensor is may be the pupil plane Ep since the light intensity distribution on the pupil plane Ep depends on the type of the reticle pattern. Furthermore, for example, exposure light IL focused to a spot by using a variable blind 10 may be applied to the reticle and relative scanning performed between the spot light and the reticle. At this point, the light intensity distribution on the pupil plane Ep and the area of each pattern on the mixed reticle can be obtained from the photoelectric signal output from the photoelectric sensor. This method provides an advantage in that the above various data need not be entered in the main controller 50 by the operator nor stored in the memory.

Figure 12A:
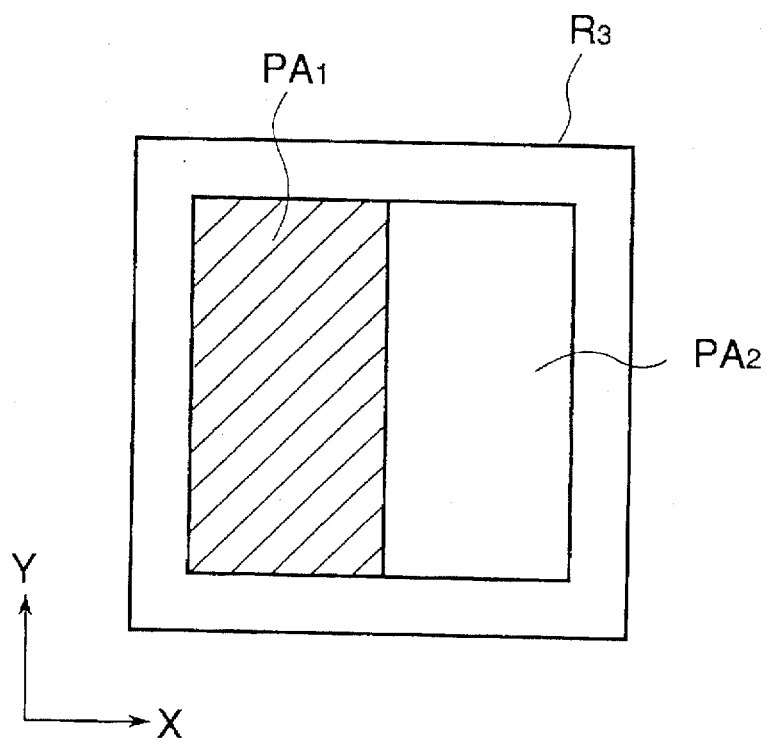
FIG. 12A is a diagram illustrating another example of structure of the mixed reticle and FIG. 12B is a diagram illustrating a focal plane of the mixed reticle shown in FIG. 12A.
Figure 12B:
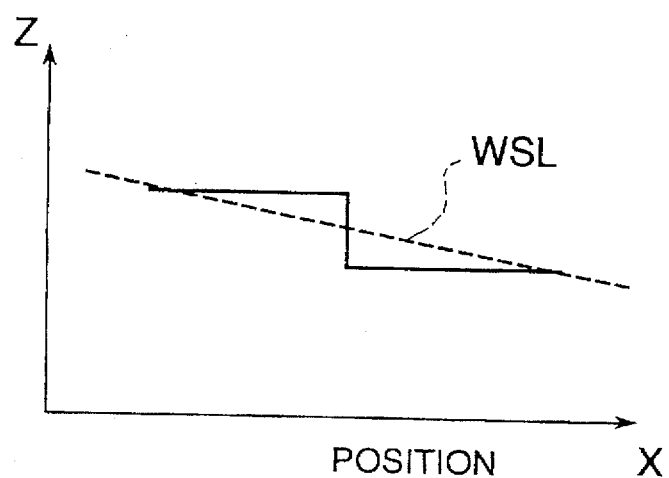

Although the entire exposure field is adjusted to the intermediate focusing position in the above embodiments, more optimum compensation can be obtained by relatively tilting the imaging plane and the wafer surface if one type of the pattern is distributed with partial deviation on the reticle. For example, supposing that the mixed reticle $R_3$ has two pattern areas $PA_1$ and $PA_2$ horizontally divided within a form as shown in FIG. 12A and a phase-shifted pattern is formed in the pattern area $PA_1$ and a normal pattern is in the pattern area $PA_2$, the focusing positions (the imaging plane of the projection optical system PL) of the pattern areas $PA_1$ and $PA_2$ are stepped as shown in FIG. 12B. In such case, the wafer W can be tilted with the wafer stage WS to match the surface with the plane WSL indicated by the dotted line in the FIG. 12B. This greatly reduces the focus error on the entire shot area. Instead of tilting the wafer W, the imaging plane of the projection optical system PL can be tilted by the control section 53 to obtain the relationship in FIG. 12B.

Figure 13A:
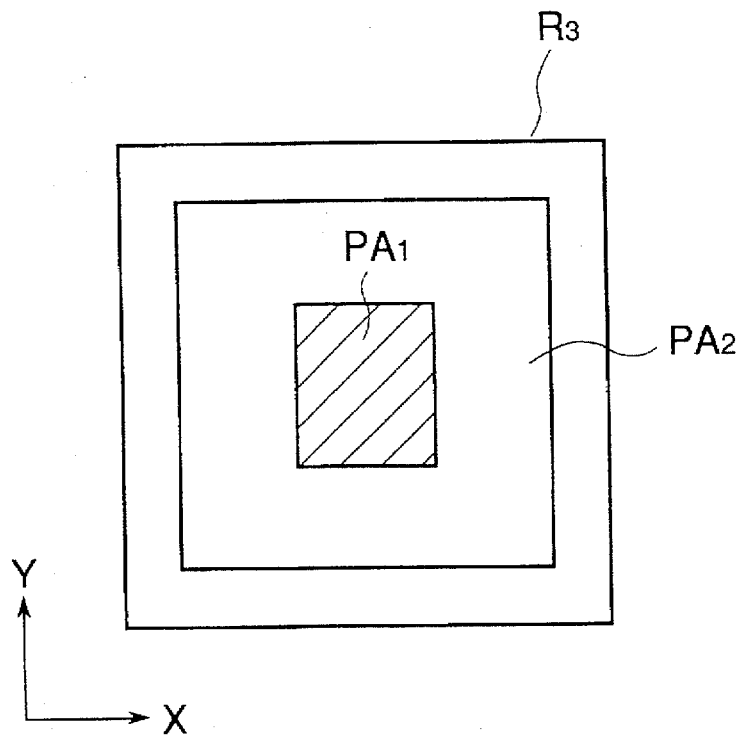
FIG. 13A is another example of the structure of the mixed reticle and FIG. 13B is a diagram illustrating the focal plane of the mixed reticle shown in FIG. 13A.
Figure 13B:
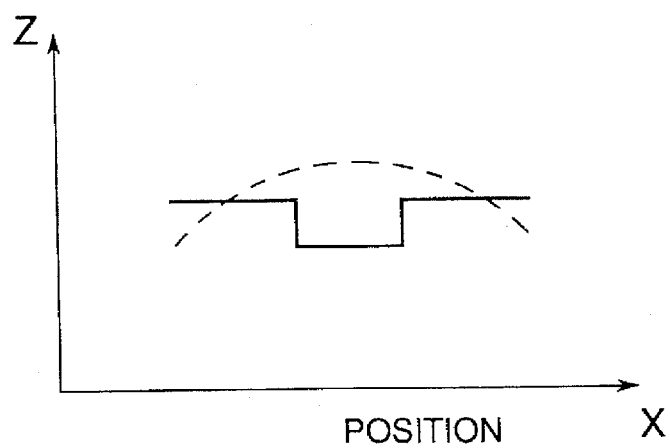

If the pattern in the central portion is not identical to that in the peripheral portion, image plane warping can be generated intentionally to obtain the same effect as that mentioned above. For example, 10 supposing that the mixed reticle $R_3$ in FIG. 13A has the pattern area $PA_1$ in the central portion and the pattern area $PA_2$ in the peripheral portion, and a phase-shifted pattern is formed in the pattern area $PA_1$ and a normal pattern is in the pattern area $PA_2$, the focusing positions (the imaging plane of the projection optical system PL) of the pattern areas $PA_1$ and $PA_2$ are as shown in FIG. 13B. In such case, preferably image plane warping is generated on the projection optical system PL by the control section 53 or a change is made so as to make the image plane of the projection optical system PL almost flat or to reduce the unevenness to a specified value or smaller. For this purpose, it is recommended to generate image plane warping indicated by the dotted line in FIG. 13B. This greatly reduces the focus error in the entire shot area.

Further, although the method of intermitting the exposure is described for the case that the focusing position of one pattern is quite different from that of the other in the above embodiments, there can be a twice exposure method at the respective best focusing positions while intercepting the light with the variable blind 10 if one pattern is distributed with partial deviation on the reticle as described above.

The above embodiments address an example of the absorption of the exposure light. The same method can also be used to solve a problem where variations of the imaging characteristics on the projection optical system PL, due to an environmental change, such as a change of atmospheric pressure or of temperature, depend on the pattern on the mixed reticle.

The above embodiments are described, supposing that the mixed reticle having a normal pattern and the phase-shifted pattern is used. If the illuminating conditions are changed from the normal illumination to the grading illumination (or ring zone illumination) with the replacement of the fly pupil lens group by using the drive system 54, the imaging characteristics (for example, the focusing position) may depend on the pattern area like the above-mentioned embodiment, for example, on the reticle having pattern areas whose preciseness is not identical. It is also recommended that the optimum conditions are determined from the imaging characteristics depending on each pattern area in the same manner as the above embodiments for focusing or compensation of the imaging characteristics based on the determined conditions.

In addition, this invention is understood to be applied to the device for exposing a reticle pattern on the wafer with the reticle and the wafer fixed relative projection optical system in the above embodiments. Quite the same effect can be obtained when this invention is applied to a device for exposing the image of the reticle pattern on the wafer under scanning, by applying the illuminating light IL only to a local area (rectangle, circular, hexagonal, etc.) on the reticle and moving the reticle and the wafer synchronously, as disclosed in U.S. Pat. No. 4,924,257 and U.S. Pat. No. 5,194,893.

The mixed reticle having the normal pattern and the phase-shifted pattern is formed generally by partly superposing the phase shifter (SOG, etc.) on the pattern of the normal reticle. Therefore, the phase-shifted pattern on the mixed reticle is of the space frequency modulation type (Rebenson type) or of the edge-emphasized type. The phase-shifted pattern on the mixed reticle, however, can be other types, for example, halftone or shifter shielding type.

What is claimed is:

1. A projection exposure apparatus, comprising:
   an illumination optical system for irradiating illuminating light to a mask having a plurality of patterns, of which forming conditions are different from each other;
   a projection optical system for projecting images of said plurality of patterns simultaneously onto a photosensitive substrate;
   a correcting device for simultaneously correcting imaging errors of said pattern images; and
   a controller for controlling an operation of the correcting device such that each of the imaging errors is corrected so as not to exceed a predetermined value.

2. An apparatus according to claim 1, wherein said mask includes a pattern comprising a light transparent part and a light shielding part, and a pattern having a phase shifting member which shifts a phase of said illuminating light by about an odd number multiple of ρ.

3. An apparatus according to claim 1, wherein said plurality of patterns on said mask have finesses which are different from each other.

4. An apparatus according to claim 1, further comprising an input device for inputting information corresponding to each of said forming conditions of said patterns, said controller including a calculator which calculates the imaging errors of said pattern images based on the inputted information.

5. An apparatus according to claim 1, wherein said correcting device includes a device to relatively move an image plane of said projection optical system and said photosensitive substrate in a direction of an optical axis of said projection optical system.

6. An apparatus according to claim 1, wherein said correcting device includes at least one of an optical element of said projection optical system and a driving device for moving said mask.

7. An apparatus according to claim 1, wherein said controller includes a calculator which calculates a correction amount of a single imaging error common to said plurality of pattern images, and an exposing operation is stopped when the common correction amount does not exist.

8. An apparatus according to claim 1, wherein said controller includes a calculator which calculates variation of the imaging errors of said pattern images, and which determines a correction amount of a single imaging error common to said plurality of pattern images in accordance with the calculation result.

9. An apparatus according to claim 1, further comprising a device for changing a distribution of intensity of the illumination light on a pupil plane of said illuminating optical system in accordance with the pattern forming conditions on said mask, said controller including a calculator which calculates imaging errors of said pattern images based on a distribution of intensity of the illumination light corresponding to the pattern forming conditions.

10. A projection exposure apparatus, comprising:
    a projection optical system for projecting a plurality of pattern images of a mask simultaneously onto a photosensitive substrate, said pattern images having respective distribution states of imaging beams on a pupil plane that are different from each other;

a device for detecting a correction amount of a single imaging error common to said pattern images, based on the distribution states of the imaging beams; and an adjusting device for simultaneously changing the imaging conditions of said pattern images in accordance with the detected correction amount.

11. An apparatus according to claim 10, wherein said detecting device includes a calculator which calculates imaging errors of said pattern images in accordance with the distribution states of the imaging beams and aberration of said projection optical system, said correction amount being determined based on the calculated imaging errors.

12. An apparatus according to claim 10, wherein said adjusting device includes a device to relatively move an image plane of said projection optical system and said photosensitive substrate in a direction of an optical axis of said projection optical system.

13. An apparatus according to claim 10, wherein said adjusting device includes at least one of an optical element of said projection optical system and a driving device for moving said mask.

14. An apparatus according to claim 10, further comprising a controller for stopping an exposing operation when the correction amount common to said pattern images does not exist.

15. An apparatus according to claim 10, wherein said detecting device includes a calculator which calculates variation of the imaging errors of said pattern images, said controller controlling the exposing operation in accordance with a calculation result obtained by said calculator.

16. A microdevice manufactured using an apparatus as defined in claim 1.

17. A microdevice manufactured using an apparatus as defined in claim 10.

18. A projection exposure apparatus, comprising:

a projection optical system for projecting images of plural patterns of a mask simultaneously onto a substrate, said patterns having imaging light distributions on a pupil plane that are different from each other; and a device for moving at least one of said mask, an optical element of said projection optical system, and said substrate in accordance with a single correction amount common to said images so as to correct different errors of said images.

* * * * *

UNITED STATES PATENT AND TRADEMARK OFFICE
CERTIFICATE OF CORRECTION

PATENT NO. : 5,710,620
DATED      : January 20, 1998
INVENTOR(S): Tetsuo Taniguchi It is certified that error appears in the above-indentified patent and that said Letters Patent is hereby corrected as shown below:

On the Title Page:

In the Foreign Application Priority Data:

"March 16, 1994" should read --March 16, 1993--.

Signed and Sealed this

Twelfth Day of May, 1998

*Attest:*

BRUCE LEHMAN

*Attesting Officer*     Commissioner of Patents and Trademarks